United States Patent [19]
Wagner

[11] Patent Number: 4,812,779
[45] Date of Patent: * Mar. 14, 1989

[54] LOW-POWER FEEDFORWARD AMPLIFIER

[75] Inventor: R. Steven Wagner, El Paso, Tex.

[73] Assignee: Texscan Corporation, Scottsdale, Ariz.

[*] Notice: The portion of the term of this patent subsequent to Jun. 30, 2004 has been disclaimed.

[21] Appl. No.: 67,805

[22] Filed: Jun. 29, 1987

Related U.S. Application Data

[63] Continuation of Ser. No. 833,651, Dec. 8, 1986, Pat. No. 4,677,390.

[51] Int. Cl.$^4$ .......................... H03F 1/26; H03G 3/10
[52] U.S. Cl. ..................................... 330/149; 330/151; 330/278
[58] Field of Search ...................... 330/149, 278, 151

[56] References Cited

U.S. PATENT DOCUMENTS

| | | | |
|---|---|---|---|
| 4,258,328 | 3/1981 | Prevot et al. | 330/149 |
| 4,677,390 | 6/1987 | Wagner | 330/149 |

FOREIGN PATENT DOCUMENTS

| | | |
|---|---|---|
| A2734945 | 2/1979 | Fed. Rep. of Germany . |
| A2418981 | 9/1979 | France . |
| A2117990 | 10/1983 | United Kingdom . |

Primary Examiner—Gene Wan
Attorney, Agent, or Firm—Woodard, Emhardt, Naughton, Moriarty & McNett

[57] ABSTRACT

A feedforward trunk amplifier having the distortion advantages associated with the feedforward topology while providing significantly reduced power consumption and cost. The trunk amplifier has a discrete preamplifier including active gain and slope control, and a low-power feedforward output stage including a medium-gain, hybrid main amplifier, a high-gain, discrete error amplifier having two gain stages which share the same bias current, and miniature coaxial cable delay lines mounted on the cover of the amplifier housing.

13 Claims, 6 Drawing Sheets

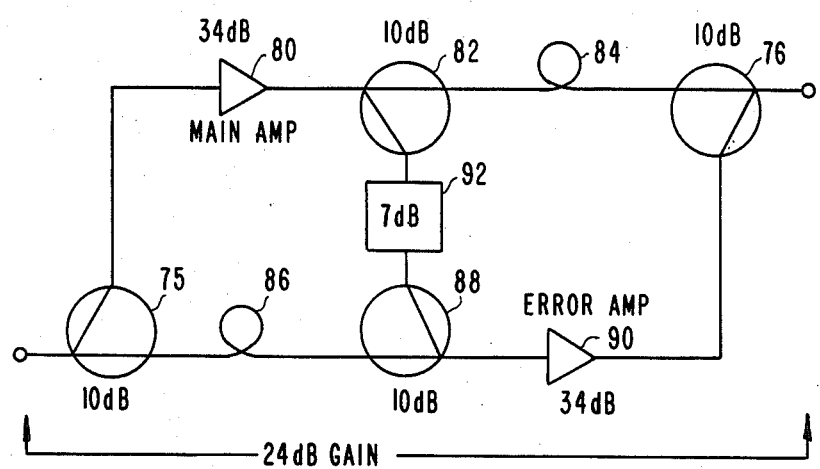
Fig. 5 PRIOR ART FEEDFORWARD
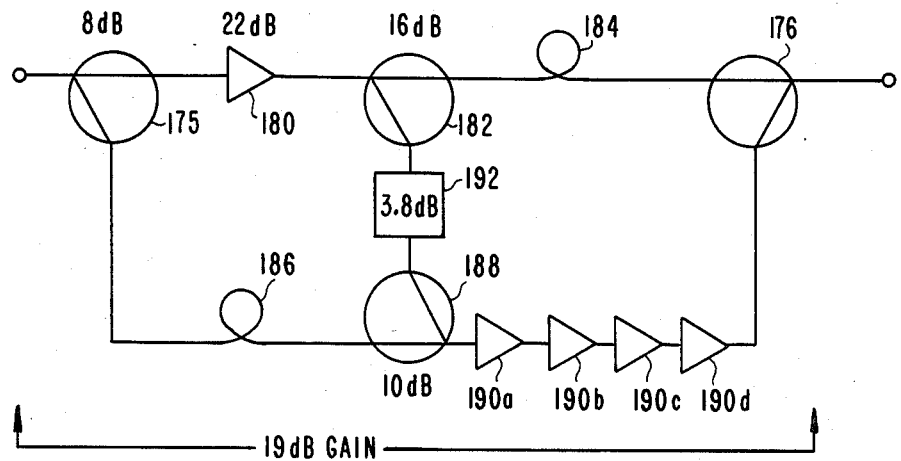
Fig. 6 LOWER POWER FEEDFORWARD

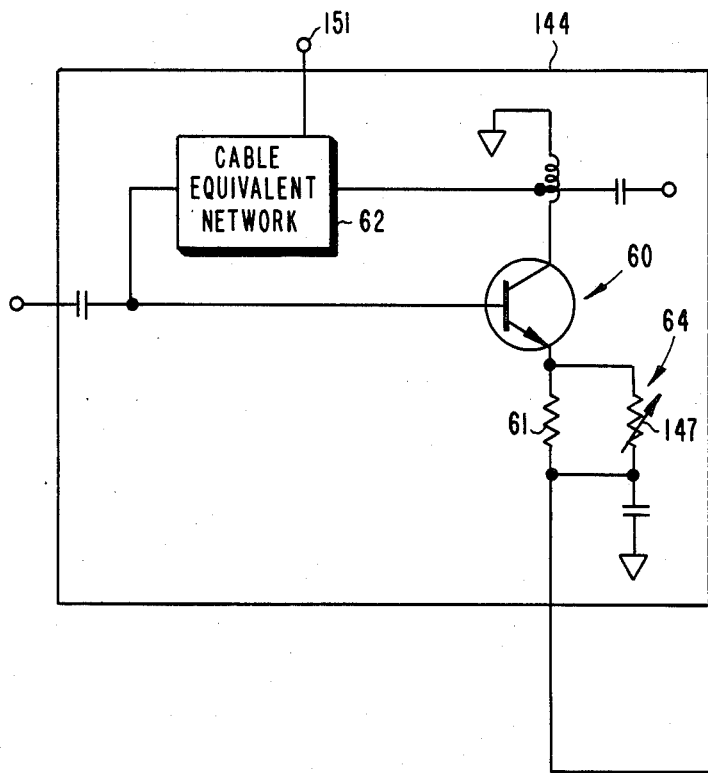
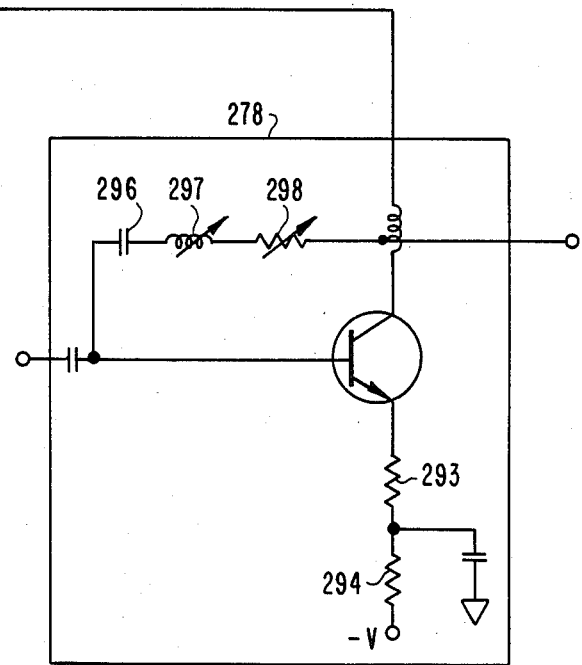
Fig.10

LOW-POWER FEEDFORWARD AMPLIFIER

This application is a continuation of application Ser. No. 833,651, filed Dec. 8, 1986, now U.S. Pat. No. 4,677,390 issued June 30, 1987.

BACKGROUND OF THE INVENTION

This invention relates to low-distortion amplifiers, and particularly to feedforward amplifiers.

Feedforward is a well-known technique for reducing the effects of distortion and noise products generated by an amplifier. A sample of the amplifier's output signal is compared with a sample of its input signal to produce an error signal proportional to the internally generated distortion and noise products, and the error signal is amplified and combined with the amplifier's output signal in opposite phase to substantially cancel the distortion and noise products.

Feedforward is particularly useful in signal transmission systems employing coaxial lines, where amplifiers are often connected in cascade for periodic signal boosting to overcome line attenuation. Cascading of amplifiers is routine in CATV systems, for example, where television and other signals are transmitted from a central transmitting station, known as the head end, via a coaxial line network having one or more trunk lines and a number of feeder lines connected to each trunk line. Trunk amplifiers are spaced at appropriate intervals along each trunk line to amplify signals being transmitted through the system, and bridging amplifiers are connected to trunk amplifiers to provide multiple high-level outputs for driving feeder lines. Subscriber taps are coupled to the feeder lines, which typically also include line extender amplifiers which boost the transmitted signals and thereby extend the feeder lines. Many systems also include a return trunk for two-way transmission. A feedforward topology reduces distortion products generated in the process of signal amplification and thereby allows operation at higher signal levels at the output of any one amplifier station with an acceptable level of distortion, thus facilitating bandwidth expansion, i.e., carriage of more channels without incurring significant degradation in distortion performance. The higher output levels are required to overcome the increased cable attenuation at higher frequencies.

A 20 dB reduction in third order distortions such as composite triple beat and crossmodulation effects can be achieved with feedforward topologies, but with power consumption three times that of a hybrid amplifier, the conventional gain block in broadband CATV distribution systems prior to the use of feedforward. The localized threefold increase in power associated with the feedforward device requires a copper heat spreader to distribute the heat throughout the station. An adequate heat spreader occupies a substantial amount of space in an amplifier station and, due to labor-intensive machining, is an expensive item. Without considering heat spreader costs, a feedforward device already costs approximately ten times as much as a conventional hybrid module. Because of these and other limitations, the heat spreader concept seriously impairs upgradability, via field retrofits, to existing stations. In some instances, field upgrading of trunk stations to feedforward requires removal of all modules, including, as will be described later, forward, reverse and bridger amplifiers and AGC, so that the heat spreader may be installed in the station. In addition to the inconvenience to the technician in installing the new equipment, there would be an undesired interruption in service along the return segment of the trunk. Some systems employ telemetry and security systems along the return trunk, and a breach of security is unacceptable. Moreover, although a heat spreader allows feedforward in a trunk amplifier module, it is ineffective at heat dispersion when feedforward is also used in the bridger module, where it is required for system upgrades in bandwidth.

Another problem with current feedforward amplifiers involves high-gain hybrids, that is, hybrids having gain of 34–38 dB, which are commonly used as building blocks for such amplifiers, as will be described later in more detail. High-gain hybrids have frequency response problems which hybrid manufacturers have not adequately resolved for devices operating from a negative power supply. Since adequate negative-supply feedforward devices are lacking, existing product lines using a negative power supply cannot be upgraded to feedforward topology without installation of a dual-polarity power supply in the station to operate positive-supply feedforward devices along with the negative-supply conventional devices utilized in the other amplifier modules. This causes a serious impact in station space availability and increases cost.

SUMMARY OF THE INVENTION

The present invention provides an improved amplifier having the distortion advantages of feedforward and the low power consumption of conventional hybrid amplifiers.

A low-power feedforward amplifier according to one aspect of the invention comprises a main amplifier and means for comparing a sample of an input signal supplied to the main amplifier with a sample of the main amplifier's output signal, the comparing means producing an error signal proportional to the difference between the signal samples. The amplifier further comprises means for amplifying the error signal and combining the amplified error signal with the main amplifier output signal in opposite phase, whereby distortion and noise products generated by the main amplifier are substantially cancelled. The amplifying and combining means includes an error amplifier having a plurality of gain stages which share the same bias current.

According to an aspect of the invention particularly applicable to CATV systems, a low-power feedforward amplifier is provided which comprises an active gain and slope control network operative in conjunction with a feedforward stage, the feedforward stage including a main amplifier, means for comparing a sample of an input signal supplied to the main amplifier with a sample of the main amplifier's output signal, the comparing means producing an error signal proportional to the difference between the signal samples, and means for amplifying the error signal and combining the amplified error signal with the main amplifier output signal in opposite phase, whereby distortion and noise products generated by the main amplifier are substantially cancelled.

A general object of the present invention is to provide an improved feedforward amplifier.

Another object is to provide a feedforward amplifier having reduced power consumption.

A further object of the invention is to reduce interstage losses in a multistage trunk amplifier module.

BRIEF DESCRIPTION OF THE DRAWINGS

FIG. 5 is a block diagram of a prior art feedforward amplifier.

FIG. 6 is a block diagram of a low-power feedforward amplifier employed according to the preferred embodiment of the present invention as the output stage of an amplifier such as shown in FIG. 3.

FIG. 10 is a schematic diagram illustrating current sharing between isolated amplifiers.

DESCRIPTION OF THE PREFERRED EMBODIMENT

Figure 1:
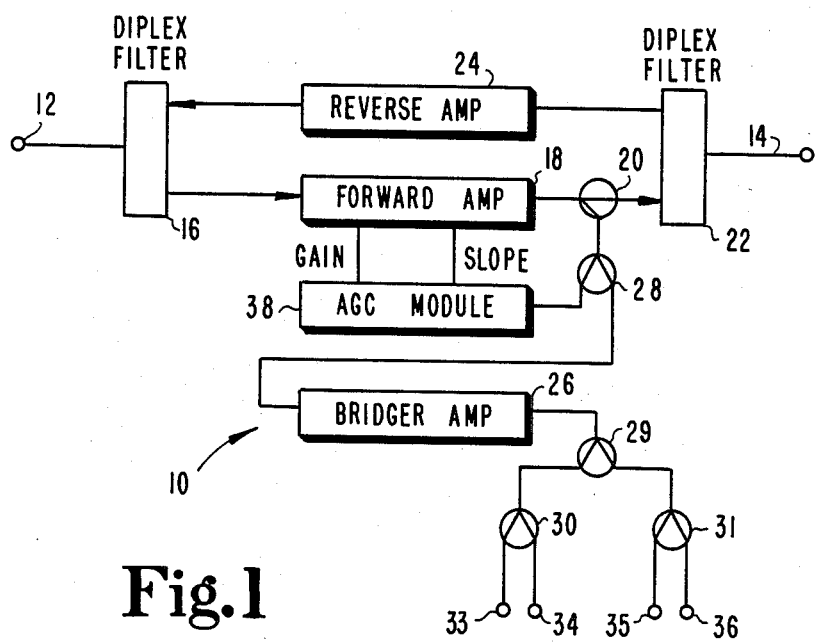
FIG. 1 is a block diagram of a trunk amplifier station of the type used in a CATV system.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

The preferred embodiment of the present invention is a CATV feedforward amplifier, specifically a feedforward amplifier used as an output stage in a multistage CATV amplifier. However, the principles of the invention may be advantageously applied to amplifiers, including single-stage amplifiers, for use in other types of systems where low distortion and low power consumption are desired.

As stated previously, television and other signals are transmitted from the head end of a CATV system via a coaxial line network having one or more trunk lines which each have a number of associated feeder lines. The signals carried by each trunk are periodically amplified by trunk amplifiers to overcome cable attenuation. Trunk amplifier spacing is thus a function of cable attenuation and, accordingly, is customarily specified in dB to account for different losses per unit length associated with different types of cable. Bridging amplifiers connected to the trunk amplifiers provide multiple high-level outputs for driving feeder lines, which typically include line extender amplifiers.

A trunk station according to the preferred embodiment of the invention is shown in block diagram form in FIG. 1 wherein it is represented generally by reference numeral 10. Trunk station 10 is a two-way CATV trunk amplifier unit connected to the trunk by lines 12 and 14 on the upstream (head end) and downstream sides of the station, respectively. Trunk signals from the head end are amplified and conducted downstream through line 12, diplex filter 16, forward amplifier 18, directional coupler 20, diplex filter 22 and line 14. Trunk signals from downstream sources are amplified and conducted upstream through line 14, diplex filter 22, reverse amplifier 24, diplex filter 16, and line 12. The trunk station includes a bridger amplifier 26 connected to the output of forward amplifier 18 through directional couplers 20 and 28. The signal received from the forward amplifier is amplified by bridger amplifier 26 and then split into four signals by directional couplers 29, 30 and 31. Those four signals are coupled to separate feeder lines along output lines 33, 34, 35, and 36. The output of forward amplifier 18 is also connected, through directional couplers 20 and 28, to an automatic gain control (AGC) module 38 provided with circuitry for automatic control of forward amplifier gain and slope, characteristics which will be explained further below. AGC module 38 supplies control signals to forward amplifier 18 along the GAIN and SLOPE output lines for control of forward amplifier gain and slope. Elementary components suitable for the trunk station functions just described are commercially available, and are available as individual plug-in modules from Texscan El Paso, 1440 Goodyear Drive, El Paso, Tex. 79936. Trunk station 10 also includes circuitry and controls (not shown) for manual control of gain and slope. Forward amplifier 18 and bridger amplifier 26 are both feedforward amplifiers of similar architecture, and the circuitry described herein as to the forward amplifier is suitable with minor modifications for use in a bridger amplifier. Also, reverse amplifier 24 can be implemented as a feedforward amplifier applying the teachings of the present invention. Such an implementation is desirable for mid-split systems, in which an increased number of channels are carried in the return segment for transmission of programs from multiple local origination sources, and the bandwidth of the forward segment is correspondingly reduced. Trunk station 10 is preferably housed in a hinged case (not shown) for easy access, and each amplifier in the station is a plug-in module with a housing having both a top and bottom cover (not shown).

Trunk station 10, including the feedforward amplifiers contained therein, is powered by a single −24 volt DC power supply. Present-day high-gain hybrids have significant frequency response ripple when used in negative power supply systems. The use of medium-gain hybrids in a feedforward topology allows use of a negative-voltage power supply in a feedforward device. As used herein, high-gain refers to approximately 34–38 dB, medium-gain refers to approximately 18–24 dB, and low-gain refers to approximately 12–14 dB. Also as used herein, a hybrid device is one containing thick-film construction in addition to one or more discrete components. A conventional hybrid amplifier, for example, includes integrated transistors, thick-film resistors, and discrete components including surface-mount chip capacitors and miniature toroidal transformers, the transformers being used for input and output coupling.

Figure 2:
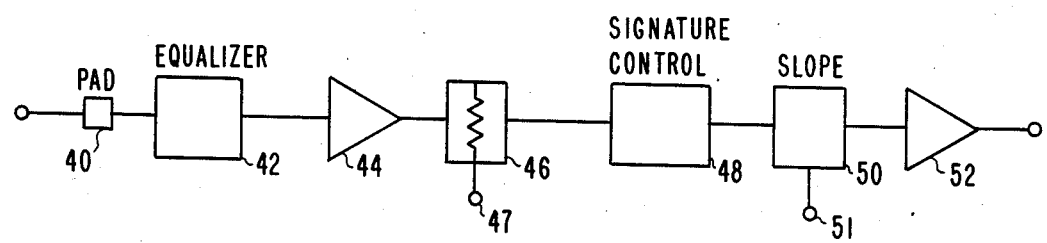
FIG. 2 is a drawing partly in schematic form and partly in block diagram form of a conventional forward amplifier for use in the trunk amplifier station shown in FIG. 1.

FIG. 2 depicts in block diagram form the circuit components contained in a conventional forward amplifier. A signal applied to the input of the amplifier is fed to a pad 40 and equalizer 42 for broadband adjustment of the signal level prior to amplification by input hybrid amplifier 44. In those installations not spaced at a typical value because of geographical or other restraints, the pad and equalizer are selected to maintain operation of the attenuator stage 46 and slope control circuit 50 at their electrical midrange positions in a nominal ambient temperature. The equalizer corrects for tilt in the incoming signal spectrum caused by frequency-dependent cable attenuation characteristics. Adjustments are made in steps. Equalization is performed at this stage because the output of the first amplifier, hybrid 44, is desirably flat across the band of interest. The gain of hybrid amplifier 44 is commonly one of three values—14, 18 or 22 dB—to provide sufficient trunk amplifier gain to support spacing of 22, 26 and 30 dB, respectively. In practice, this hybrid is selected on the basis of gain required for a desired spacing.

The amplified signal is fed to an attenuator stage 46 that works in concert with a slope control circuit 50 to maintain a constant signal level for output amplifier 52 to amplify. Whereas equalizer 42 adjusts levels in stepwise fashion, slope circuit 50 provides continous level changes. Otherwise, the two circuits are functionally similar. Amplifier 52 is a feedforward stage which may be of discrete or hybrid design. Thus, as shown in FIG. 2, a conventional feedforward amplifier contains a hybrid stage 44, an attenuator section 46 for gain adjustment, a slope section 50 for cable equalization over temperature, and a feedforward stage 52. Systems are specified by the spacing at the highest frequency. Typical values for these stages in a 22 dB-spaced system, with the attenuator and slope controls set at midrange, are 14 dB gain, 6 dB loss, 4 dB loss and 21 dB gain, respectively.

The control signal on the GAIN output line of AGC module 38 (FIG. 1) is coupled to input 47 of attenuator section 46 for attenuation control. Similarly, the control signal on the SLOPE output line of AGC module 38 is coupled to input 51 of slope section 50 for slope control. It is desirable for the controls 46 and 50 to be operated at their electrical midranges at a nominal ambient temperature to allow sufficient signal level adjustment to compensate for changes in attenuation as the cable span preceding the station expands or contracts due to temperature. By maintaining a constant signal level for the output hybrid to amplify, the distortion performance of the amplifier module remains fairly uniform over temperature. In long cascades of trunk amplifiers, response signatures may develop because of a common response anomaly. For example, the frequency response of a hybrid amplifier typically rolls off at the band edges due to bandwidth and internal ferrite devices. Additionally, peaks and valleys exist in the midband frequency response. Other devices in the system, for example, connectors and filters, can introduce common response aberrations. Such aberrations present a problem when they are common to a number of cascaded devices. Signature control circuit 48 introduces a flat loss with appropriate valleys and peaks to reduce the impact of these common response aberrations.

Figure 3:
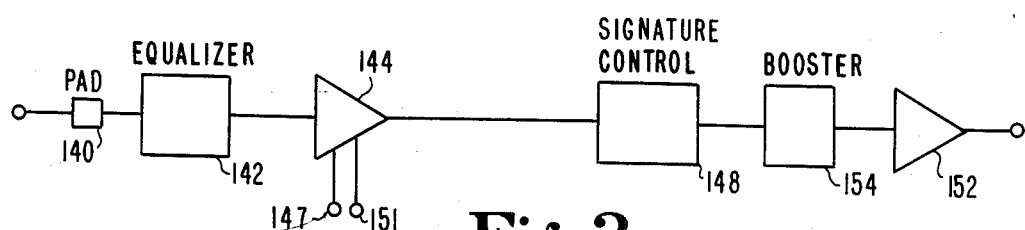
FIG. 3 is a drawing partly in schematic form and partly in block diagram form of the preferred embodiment of a forward amplifier according to the present invention.

The preferred embodiment of a feedforward amplifier for use as forward amplifier 18 in trunk station 10 is illustrated in block diagram form in FIG. 3. Gain and slope control are combined into the first amplifier stage 144, which has input lines 147 and 151 for control of gain and slope, respectively. Pad 140, equalizer 142, and signature control circuit 148 are the same as their corresponding circuits in the forward amplifier of FIG. 2. Output stage 152 is a feedforward amplifier stage which will be described in more detail with reference to FIG. 6. To enable upgrades of 220 MHz systems up to 450 MHz, and to allow for gain adjustment for different trunk station spacings, amplifier 18 further includes a booster amplifier 154, a plug-in printed circuit (pc) card preferably available in three versions corresponding to gain values of 0, 4 and 8 dB, the 0 dB card consisting simply of a jumper. For example, a 22 dB-spaced system simply requires a jumper in the position of the booster amplifier. The booster amplifier is selected to fit the desired gain criterion.

Booster amp 154 is preferably a push-pull amplifier to obtain good second order distortion performance. It is mounted on a plug-in miniature printed circuit board which mounts into a mother board in forward amplifier 18. A number of other stages within the forward amplifier are configured as plug-in circuit boards, including active gain and slope control circuit 144, signature control circuit 148, and, in feedforward amplifier 152, a hybrid trim amplifier (to be described below) as well as separate first and second stages of the error amplifier. The error amplifier is configured as two plug-in gain stages each having two cascaded stages. Additionally, the bottom cover of the amplifier includes means for quickly connecting it to the mother board of the amplifier module. This construction enhances producibility of the trunk amplifier by enabling module-by-module testing and troubleshooting.

Figure 4A:
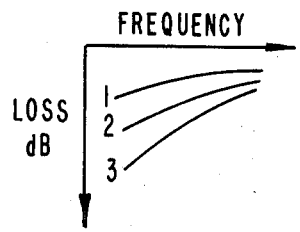
FIGS. 4A-4E depict an active gain and slope control network according to the present invention, along with related operating curves.

Some of the advantages of the present invention may be appreciated by considering the method of achieving the adjustable cable compensation in circuits 46 and 50 (FIG. 2). Most amplifiers of this type provide a cable adjustment of +/−4dB from the nominal operating spacing of the cable, which for many CATV systems is approximately 22 dB at the highest operating frequency. With the gain and slope controls set at midrange, the insertion loss of attenuator 46 is typically 6 dB flat, and slope circuit 50 has typically 4 dB loss at the highest operating frequency, with the loss following the inverse of cable response. To achieve cable tracking over temperature, the gain and slope controls work in concert, as will now be described. It will be understood that insertion loss refers to high-frequency insertion loss. FIG. 4A illustrates the loss characteristic of slope circuit 50 with three curves, labeled 1, 2 and 3, which correspond with low, nominal and high ambient temperatures, respectively. Curve 1 has a response characteristic to compensate for a 4 dB decrease in station spacing caused by cable shrinkage at low temperature. The attenuator 46 works in concert with slope circuit 50, adjusting in a continuous fashion from 6 dB flat loss at nominal to 10 dB flat loss at low temperature. Similarly, curve 3 has a response characteristic to compensate for a 4 dB increase in spacing caused by cable expansion at high temperature, and attenuator 46 adjusts to 2 dB flat loss at high temperature. The loss characteristic of FIG. 4A is commonly referred to as a "high-end pivot" because the slope can be adjusted between curves by "pivoting" the response characteristic about a common point at the high-frequency end of the curves. This interstage loss must be overcome by the input hybrid 44. To ensure that the input hybrid does not dominate the distortion performance of the amplifier, considerable current must flow in the transistors associated with the class A cascode topology. Third order distortions are minimized by considerable current flow, and second order distortions are minimized by a balanced topology, which doubles the current consumption of the cascode topology. The interstage loss also increases the gain required of the input stage.

Figure 4B:
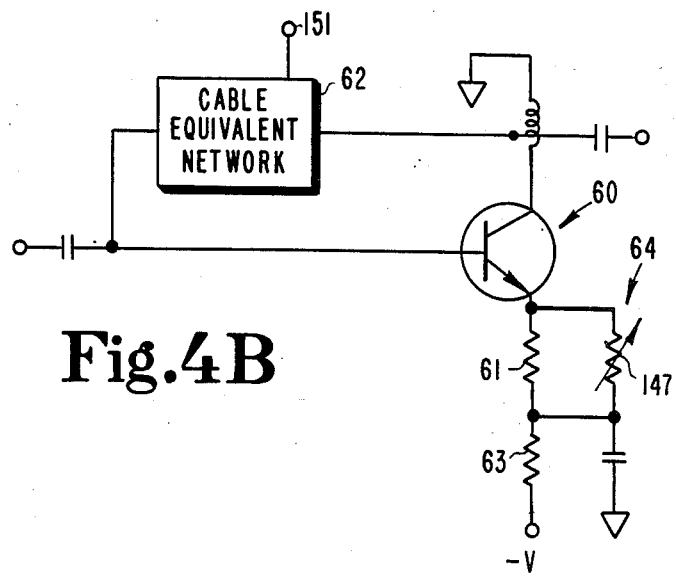
Figure 4C:
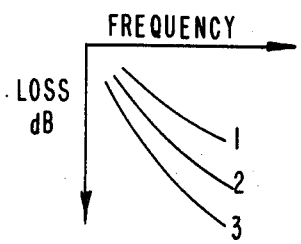
Figure 4D:
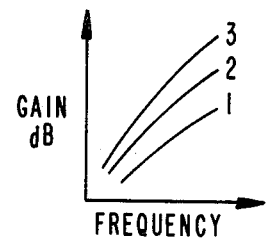
Figure 4E:
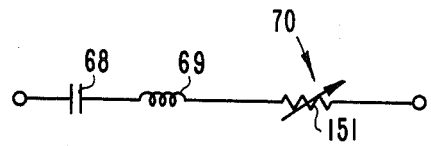

The present invention provides a means for achieving cable adjustment while providing gain at reduced current consumption, as will be described with reference to FIGS. 4A-4E. FIG. 4B is a schematic representation of gain and slope control amplifier 144. A common-emitter amplifier stage 60 has a feedback network 62 that provides cable-equalized gain. FIG. 4C illustrates the loss characteristic of cable-equivalent network 62. In this figure, curve 2 corresponds with nominal ambient temperature, while high-temperature response is shown in curve 3 and low-temperature response in curve 1. The high-temperature and low-temperature losses at the high-frequency end are each 4 dB away from nominal, for a total of 8 dB of cable tracking, the same as FIG. 4A. However, FIG. 4C illustrates a "low-end pivot" loss characteristic. FIG. 4D shows the corresponding low-end pivot gain characteristic for the slope control circuit in gain and slope control amplifier 144. The curves of FIG. 4C approximate the inverse square-law response associated with copper losses in coaxial cable. Coaxial cable also has a dialelectric loss which is linear with frequency, but, for the half-inch to one-inch cables which are used for CATV trunk lines, that loss is negligible compared to the copper loss for frequencies below 600 MHz. Gain is controlled by a control signal applied to control line 147, and slope control is effected through control line 151. Although control line 147 is depicted as the control mechanism of a variable resistance element 64, variable resistance element 64 is implemented with a PIN diode which receives its control input on line 147. One embodiment of a cable-equivalent network 62, shown in FIG. 4E, is a network consisting of a capacitor 68, inductor 69, and a variable resistance 70 which is also implemented with a PIN diode. The signal on control line 151 determines the resistance of PIN diode 70. The gain of stage 144 is approximately 10 dB, which approximately equals the combined gain of a 14 dB input hybrid 44 and a passive slope circuit 50 having approximately 4 dB of loss. The reduced gain of the network comprising 60 and 62 and associated components allows lower operating bias as the signal level is lower.

Active gain and slope circuit 144 replaces two passive circuits that contribute significantly to the module's interstage losses. The loss that is incurred with the passive topology must be overcome with the appropriate gain device at the input of the amplifier. This is achieved at the expense of distortion contribution from the input device. By eliminating as much interstage loss as is practical, the gain and signal levels can be reduced accordingly. Lower signal levels will require less distortion capability from the input device. Hence, the input device can be a discrete amplifier stage, which has a significantly lower current consumption than a conventional hybrid amplifier. Accordingly, amplifier 144 is a discrete stage. An improvement in second order distortion performance can be achieved by employing a push-pull topology for this stage. Such a topology has current consumption somewhat greater than that for the single-ended topology shown in FIG. 4B but still allows a significantly reduced current consumption over a conventional hybrid amplifier. The savings in current consumption contribute significantly to the overall reduction in current consumption of the feedforward amplifier.

The configuration and operation of feedforward output stage 152 of feedforward amplifier 18 will now be described. The basic feedforward topology has been described in a number of patents and articles, for example, U.S. Pat. No. 4,028,634 to Tentarelli, issued June 7, 1977; U.S. Pat. No. 4,130,807 to Hall et al., issued Dec. 19, 1978; and "Feedforward" by Charles Evans, in Communications/Engineering Digest, April, 1977. It is also illustrated in block diagram form in FIG. 5. As shown there, a feedforward amplifier includes two parallel signal paths, a main path and a feedforward path, connected to common input and output terminals through directional couplers 75 and 76. The main path includes a main amplifier 80, a delay line 84, and a directional coupler 82 interconnecting the main amplifier and the delay line. Delay line 86, directional coupler 88 and error amplifier 90 comprise the feedforward path. An attenuation network 92 interconnects the first and second directional couplers. In this device, main amplifier 80 and error amplifier 90 are both 34 dB gain hybrid amplifiers having similar operating characteristics. All couplers are 10 dB couplers, which have approximately 10 dB loss at the coupled port and approximately 1 dB through loss. An incoming signal is input to directional coupler 75 which couples the signal to the main amplifier 80. The signal is amplified and passes to the output through coupler 82, delay line 84 and coupler 76. A portion of the input signal is fed forward and arrives at the input to the error amplifier 90 by way of delay line 86 and coupler 88. Simultaneously, a portion of the amplified signal from main amplifier 80 is coupled, padded, and injected by coupler 82, 7 dB attenuation pad 92, and coupler 88 respectively, to effectively cancel the signal arriving at error amplifier 90 from the input port. The signal present at the error amplifier contains the distortion products and noise power developed by the main amplifier. The error amplifier amplifies the distortion and noise generated by the main amplifier and injects this signal into the output circuit, thereby cancelling to a high degree the distortion and noise associated with the main amplifier. The state of the art allows approximately a 20 dB improvement in third order distortions such as composite triple beat and crossmodulation.

A significant disadvantage with the above process as it pertains to CATV amplifiers is the considerable increase in power consumption over that of a comparable hybrid amplifier module. A high gain hybrid draws 340 mA of current which is approximately 120 mA more than a medium gain hybrid. It will be understood that 24 volts DC is the standard for CATV amplifiers, most systems operating from +24 VDC while others use −24 VDC, and that accordingly it is appropriate to compare power consumption in terms of current drain. The combination of main and error amplifiers alone in the feedforward topology draws 680 mA versus the typical 410 mA of a conventional, non-feedforward amplifier module. Referring again to FIG. 2, including the current consumption of the input hybrid 44, the aggregate module current consumption for a feedforward trunk module is approximately 900 mA, more than double the current consumption of the non-feedforward module.

A means to reduce the current consumption of the prior art feedforward topology is shown in FIG. 6. A medium-gain hybrid is utilized for main amplifier 180. As seen in the drawing, main amplifier 180 has gain of approximately 22 dB. Each of the 10 dB couplers 176 and 188 has approximately 1 dB of through loss, while the through losses for the 8 dB coupler 175 and 16 dB coupler 182 are 1.5 dB and 0.5 dB, respectively. The delay lines 184 and 186 are preferably miniature coaxial cable on the order of one-eighth to one-sixteenth of an inch with approximately 0.3 dB loss each, as will be explained later. Thus, the gain of the feedforward stage is calculated as follows:

GAIN=(22−1.5−0.5−0.3−1) dB=18.7 dB

For ease of comparison with the amplifier of FIG. 5, the gain is rounded off to 19 dB in the drawing. Thus, the low-power feedforward amplifier of FIG. 6 has approximately the same gain as that of FIG. 5, yet the power consumption is substantially reduced and the distortion performance is still competitive. Error amplifier 190 is a four-stage common-emitter amplifier comprising amplifier stages 190a, 190b, 190c and 190d. This four-stage amplifier achieves approximately 38 dB gain while drawing only 100 mA of current. The circuit configuration which provides reduced current consumption in the error amplifier will be described shortly. The justification for reduced current consumption of this stage is that the signal being amplified has a very low average power level, hence the requirement for high bias currents has been alleviated.

Thus, the lower power feedforward topology replaces the present state-of-the-art topology, allowing gain and distortion capability competitive with the present topology, but at a current consumption that is one-half that of the present topology. A medium-gain conventional hybrid is utilized as the main amplifier, with the RF attributes of this hybrid being compensated by a discrete preamplifier, as will be described with reference to FIG. 9. The error amplifier comprises a multi-stage discrete amplifier. With adequate loop cancellation, the effects of distortion being introduced by the error amplifier are of secondary importance, allowing a significant reduction in current consumption of this stage.

Figure 7A:
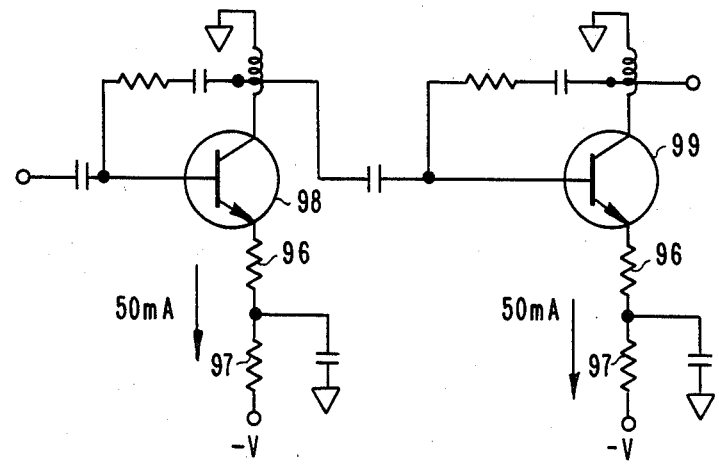
FIG. 7 is a schematic diagram illustrating the current sharing feature of the preferred embodiment of the invention.
Figure 7B:
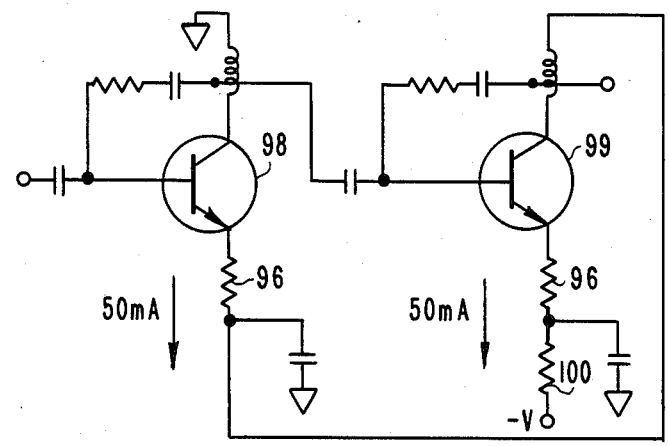

Two stages of error amplifier 190 are shown schematically in FIG. 7B, with base circuit bias resistors excluded for ease of illustration. Those skilled in the art will understand that the quiescent collector current of a transistor is a direct function of the quiescent base current, and that collector bias currents may accordingly be separately analyzed for purposes such as those described herein. A common practice in amplifier design is the use of bias dropping resistors when operating single-ended stages from a supply voltage higher than the quiescent and peak signal voltage swing. This is illustrated by FIG. 7A, which schematically depicts two cascaded stages of a multistage amplifier which does not employ current sharing techniques. A low-valued resistor 96 is provided for gain stabilization and impedance matching purposes. An additional bias dropping resistor 97 in series between resistor 96 and the −V power supply dissipates power without contributing to circuit function. The power dissipated is approximately the same as that dissipated by the amplifier stage 98. With adequate decoupling of the emitter resistor 96, two gain stages 98 and 99 may share the same biasing current, thereby reducing the current consumption by a factor of two. This is shown in FIG. 7B, wherein the voltage dropping resistors 97 are eliminated from the circuit, the connection of both stages 98 and 99 to the −V power supply is made through a low-valued resistor 100. Resistor 100 provides current limiting rather than bias dropping, and accordingly is a much smaller value than resistor 97. Due to bias current sharing, the net current consumption in error amplifier 190 is reduced from 200 mA to 100 mA.

Current sharing techniques are applied throughout the amplifier to achieve aggregate module current consumption that rivals that of conventional hybrid amplifiers. As alluded to above, this technique generally involves elimination of a voltage dropping resistor in the emitter bias network of one stage in favor of a voltage dropping resistor in another gain stage operating at quiescent levels the same as the emitter bias resistor. Both stages are in series with respect to the DC bias, and they may or may not be associated in terms of RF signal flow. As described above, this technique is employed in the error amplifier, wherein the stages are cascaded, to cut the current consumption of this stage by one-half. It is also applied to two amplifier stages which are separate from each other in terms of RF signal flow, as will be described later with reference to FIG. 10. Furthermore, it will be appreciated that this technique is equally applicable to current sharing between one stage of the error amplifier and one or more amplifiers not functionally related to the error amplifier, as well as to other applications.

Figure 8:
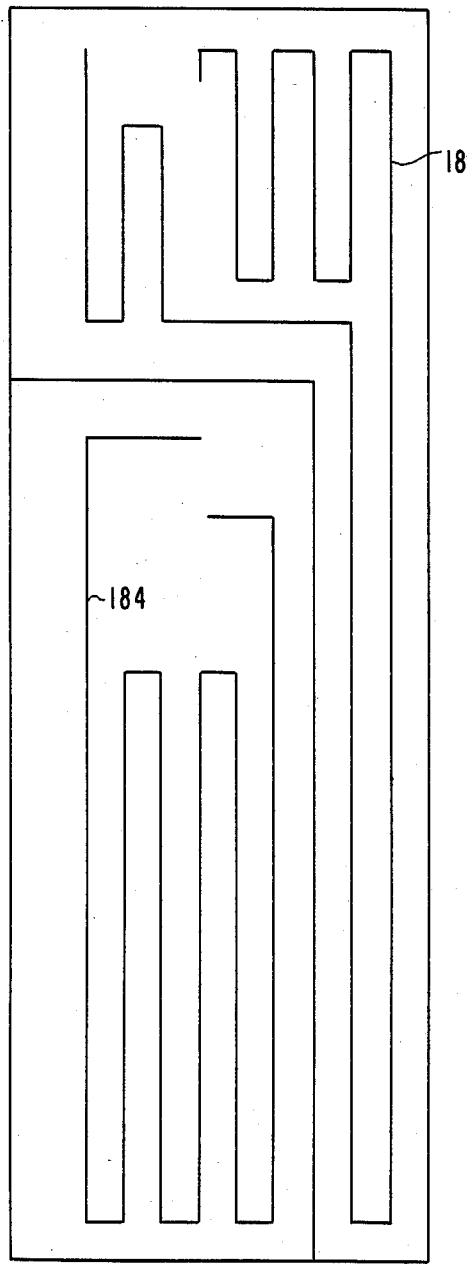
FIG. 8 is a diagram of a bottom cover of an amplifier housing showing the position of delay lines according to one embodiment of the invention.

The component density in the amplifier housing was found to be prohibitive for placement of coaxial cable as the delay mechanism in the feedforward topology. The size of the overall trunk station is limited by space restrictions imposed in some localities, and space within the trunk station and, accordingly, within the individual amplifier modules is at a premium in many other situations because of retrofit requirements. In view of space limitations within the amplifier housing, the delay lines in one embodiment are fabricated using stripline transmission line mounted on the bottom cover of the amplifier housing, as seen in FIG. 8. The ground plane associated with stripline effectively contains the RF signals within the amplifier housing. The signature control circuit 148 has adjustments that may be accessed from the top of the amplifier module, through holes in the top cover. The bottom cover's ground integrity is not broken. As space for supporting circuitry in the amplifier module is at a premium, as stated, a novel location for the placement of delay lines 184 and 186 required in the feedforward topology has been found to be the bottom cover of the amplifier module. The stripline transmission line construction of FIG. 8 achieves the delay required while maintaining acceptable shielding both for the amplifier module and for the delay lines.

The embodiment shown in FIG. 6 uses miniature coaxial cable of the aforementioned type to effect the delay lines. Miniature coax has insertion loss characteristics far superior to stripline, microstrip and lumped-element delay networks and, in that regard, is preferable over those forms of delay line. For a delay line exhibiting a 3 nanosecond delay, which is the approximate delay required at the operating frequency of a CATV amplifier module such as that disclosed herein, the insertion loss of miniature coax is on the order of 0.3-0.4 dB. By reducing the loss of the output leg seen by main amplifier 180, the distortion will be reduced accordingly.

Figure 9:
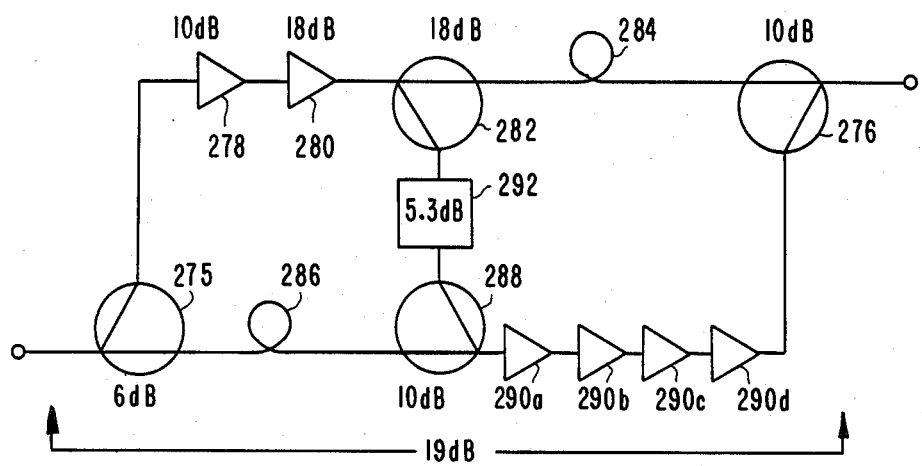
FIG. 9 is a block diagram of a low power feedforward amplifier employed according to the preferred embodiment of the present invention as the output stage of an amplifier such as shown in FIG. 3.

FIG. 9 is a block diagram of a low-power feedforward amplifier having certain advantages over the feedforward amplifier shown in FIG. 6. The amplifier of FIG. 9 includes input and output directional couplers 275 (6 dB) and 276 (10 dB), a main path including main amplifier 280, 10 dB directional coupler 282 and delay line 284, a feedforward path including a delay line 286, 10 dB directional coupler 288, and a four-stage error amplifier 290, and a 5.3 dB attenuator pad 292 in the crossover position between the main and feedforward paths. Both delay lines are constructed of miniature coax of the aforementioned type. The four stages of error amplifier 290 have gain of 9.5 dB each, or 38 dB total gain. A 5 dB pad is inserted between stages 290b and 290c to achieve the proper gain level for cancellation. Additionally, this amplifier includes a preamplifier 278, with nominal gain of 10 dB, which is used as a hybrid trim amplifier, that is, an amplifier used to trim the loop performance to compensate for varying characteristics of the hybrid amplifier used as main amplifier 280. Present-day hybrids come in gain ranges that deviate as much as 1 dB and have tilt of as much as 1.5 dB. Hybrid trim amplifier 278 provides control over the response of the cascaded gain section consisting of amplifiers 278 and 280. Response trimming in this manner enhances cancellation of distortion and noise products generated by the main amplifier and thereby alleviates yield problems associated with hybrid amplifier gain and tilt specifications. Trim amplifier 278 also includes thermal compensation circuitry to compensate for changes in hybrid amplifier 280 over temperature. In general, the gain of the hybrid amplifier is approximately inversely proportional to temperature. Thus, for optimum control of cancellation over temperature, some means for offsetting the hybrid gain changes over temperature is desirable. Hybrid trim amplifier 278 includes a thermistor network which adjusts the gain of the trim amplifier in an approximately direct proportion with temperature so as to maintain a substantially constant gain over temperature for the cascaded stages 278 and 280. Temperature compensation networks having the above-described desired characteristics are well known and therefore need no further description.

Another advantage of the embodiment shown in FIG. 9 is improved noise figure. The noise figure of a feedforward amplifier is the sum of the losses through the input directional coupler and all elements in the feedforward path, i.e., directional couplers 275 and 288, delay line 286 and error amplifier 290. Directional coupler 275 is connected with its through port rather than its coupled port connected to delay line 286 so that its through loss is incurred in the feedforward path instead of the main path. The overall noise figure of the amplifier is reduced and thereby improved because the coupler through loss is approximately 2 dB, substantially less than the 6 dB loss through the coupled port.

The gain of the feedforward stage of FIG. 9 is calculated as follows:

GAIN=(10+18−6−1−0.3−1) dB=19.7 dB

As before, the gain is nominally indicated as 19 dB.

Referring now to FIG. 10, current sharing between isolated amplifiers is illustrated schematically in an exemplary form in which active gain and slope control circuit 144 shares bias current with hybrid trim amplifier 278. Gain and slope control amplifier 144 is modified by removal of the bias dropping resistor 63 (FIG. 4B), emitter resistor 61 being connected directly to the tapped coil in the collector circuit of transistor amplifier 278. Amplifier 278 includes an emitter resistor 293, for impedance matching and gain stabilization, and a bias dropping resistor 294 connecting emitter resistor 293 to the −V supply terminal. As illustrated by FIG. 10, current consumption in the trunk amplifier module is reduced by applying the current sharing technique not only to cascade-connected amplifiers but also to amplifiers which are isolated with respect to the RF signals being amplified.

FIG. 10 also schematically illustrates the feedback network which provides the frequency response trimming to compensate for varying gain and tilt characteristics of hybrid amplifiers used as the main amplifier in the feedforward loop. DC blocking capacitor 296, variable inductance 297 and variable resistance 298 enable adjustment of both gain and tilt of the hybrid trim amplifier stage, thereby providing adjustment of the cascaded amplifier stages 278 and 280 in the main path of the feedforward amplifier of FIG. 9. The variable resistance 298 is a potentiometer which need be set only once during amplifier alignment. Variable inductance 297 is similarly set only once, and it is preferably an air-dielectric inductor.

Figure 11:
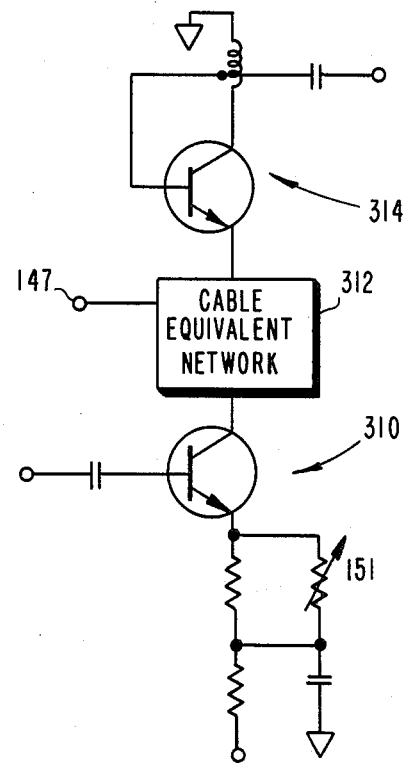
FIG. 11 is a schematic diagram depicting an alternative embodiment of an active gain and slope control network according to the present invention.

FIG. 11 illustrates, partly schematically and partly in block diagram form, a two-stage active gain and slope control circuit. This control circuit has a cascode configuration. The input to the circuit is supplied to a common-emitter stage 310 the output of which is connected through a cable-equivalent network 312 to a common-base amplifier 314. Cable-equivalent network 312 includes a bias shunting path, preferably a choke, for common conduction of bias current through stages 310 and 314. In other respects this network is similar to that shown in FIG. 4E. Gain is controlled by a control signal applied to control line 147 leading to the PIN diode connected to the emitter of stage 310, and slope control is effected through control line 151 leading to cable-equivalent network 312. This circuit configuration provides a somewhat improved distortion performance over that of a single-stage amplifier. The noise figure is improved because the gain of stage 310 is higher with cable equivalent network 312 located between the output of stage 310 and the input of stage 314 instead of in the feedback path around stage 310. The feedback path is from the collector tap of stage 314 to the base of stage 310, and the feedback network is preferably a series RLC network. An improvement in second order distortion performance can be achieved by employing a push-pull topology for this stage. Such a topology has current consumption somewhat greater than that for the single-ended topology shown in FIG. 11 but still allows a significantly reduced current consumption over a conventional hybrid amplifier.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

I claim:

1. A low-power feedforward amplifier, comprising:
   (a) a main amplifier;
   (b) means for comparing a sample of an input signal supplied to said main amplifier with a sample of an output signal from said main amplifier, said comparing means producing an error signal proportional to the difference between said signal samples; and
   (c) means for amplifying said error signal and combining the amplified error signal with the main amplifier output signal in opposite phase, whereby distortion and noise products generated by said main amplifier are substantially cancelled, said amplifying and combining means including a high-gain error amplifier having power consumption below that required by a conventional medium-gain hybrid amplifier.

2. The low-power feedforward amplifier of claim 1 wherein said main amplifier is a medium-gain amplifier.

3. The low-power feedforward amplifier of claim 2 wherein said main amplifier is a hybrid amplifier and said error amplifier is a discrete amplifier.

4. The low-power feedforward amplifier of claim 3 further comprising:
   (d) an amplifier housing having a cover,
   wherein said comparing means and said amplifying and combining means each include a delay line constructed of stripline and mounted on said cover.

5. The low-power feedforward amplifier of claim 4 further comprising:
   (e) means for energizing said main amplifier and said error amplifier from a negative-voltage power supply.

6. The low-power feedforward amplifier of claim 3 further comprising:
   (d) an amplifier housing having a cover,
   wherein said comparing means and said amplifying and combining means each include a delay line constructed of miniature coaxial cable and mounted on said cover.

7. The low-power feedforward amplifier of claim 6 further comprising:
   (e) means for energizing said main amplifier and said error amplifier from a negative-voltage power supply.

8. The low-power feedforward amplifier of claim 1 wherein said main amplifier is a medium-gain amplifier and said error amplifier is a high-gain amplifier.

9. The low-power feedforward amplifier of claim 8 wherein said main amplifier is a hybrid amplifier and said error amplifier is a discrete amplifier.

10. The low-power feedforward amplifier of claim 8 further comprising:
    (e) means for energizing said main amplifier and said error amplifier form a negative-voltage power supply.

11. A low-power feedforward amplifier, comprising:
    (a) a main path and a feedforward path, said main path including
        (1) a main amplifier;
        (2) a first delay line; and
        (3) a first directional coupler directly interconnecting said main amplifier and said first delay line;
    said feedforward path including
        (1) a second delay line;
        (2) a high-gain error amplifier having power consumption below that required by a conventional medium-gain hybrid amplifier; and
        (3) a second directional coupler directly interconnecting said second delay line and said error amplifier;
    (b) an input directional coupler directly interconnecting a signal input of said feedforward amplifier, said main amplifier and said second delay line;
    (c) an output directional coupler directly interconnecting said first delay line, said error amplifier, and a signal output of said feedforward amplifier; and
    (d) an attenuation network directly interconnecting said first and second directional couplers.

12. The low-power feedforward amplifier of claim 11 further comprising:
    (e) an amplifier housing having a cover,
    wherein said first and second delay lines are constructed of stripline and mounted on said cover.

13. The low-power feedforward amplifier of claim 11 further comprising:
    (e) an amplifier housing having a cover,
    wherein said comparing means and said amplifying and combining means each include a delay line constructed of miniature coaxial cable and mounted on said cover.

* * * * *